United States Patent

Morishita

Patent Number: 6,057,732
Date of Patent: May 2, 2000

[54] TRANSMISSION POWER CONTROL CIRCUIT AND METHOD FOR CDMA SYSTEM

[75] Inventor: Katsuji Morishita, Kanagawa, Japan

[73] Assignee: Kyocera Corporation, Kyoto, Japan

[21] Appl. No.: 09/313,676

[22] Filed: May 18, 1999

[30] Foreign Application Priority Data

May 29, 1998 [JP] Japan ................................. 10-150248

[51] Int. Cl.[7] .............................. H03G 3/20; H03G 3/10
[52] U.S. Cl. ......................... 330/129; 330/278; 330/279
[58] Field of Search .................................... 330/129, 140, 330/278, 279

[56] References Cited

U.S. PATENT DOCUMENTS

| | | | |
|---|---|---|---|
| 5,469,115 | 11/1995 | Peterzell et al. | 330/129 |
| 5,525,922 | 6/1996 | Masarik et al. | 330/278 |
| 5,548,616 | 8/1996 | Mucke et al. | 330/129 |
| 5,606,285 | 2/1997 | Wang et al. | |

FOREIGN PATENT DOCUMENTS 8-46466  2/1996  Japan ............................... H03G 3/30

Primary Examiner—Robert Pascal
Assistant Examiner—Patricia T. Nguyen
Attorney, Agent, or Firm—Loeb & Loeb, LLP

[57] ABSTRACT

A method of controlling a transmission power in a CDMA system in which an AGC (automatic gain control) amplifier that amplifies a transmission signal, and an RF power amplifier that amplifies an output of said AGC amplifier are disposed, and a gain of said AGC amplifier is controlled by a transmission power control signal to control a transmission power, wherein first comparing means for comparing-the transmission power control signal with a predetermined reference value, and second comparing means for detecting the transmission power, and for comparing the detected transmission power with a predetermined reference value are disposed, and when only said first comparing means outputs an output signal, a signal in a direction along which the transmission power is increased is produced, and, when only said second comparing means outputs an output signal, a signal in a direction along which the transmission power is decreased is produced and the signal is added as an offset signal to the transmission power control signal, and, when both said first and second comparing means output an output signal or when both said first and second comparing means do not output an output signal, a present offset signal is held.

3 Claims, 1 Drawing Sheet

TRANSMISSION POWER CONTROL CIRCUIT AND METHOD FOR CDMA SYSTEM

BACKGROUND OF THE INVENTION

The present invention relates to a controlling circuit and method in a CDMA (Code Division Multiple Access) system in which, during an operation at the maximum transmission power, the transmission power is controlled.

Conventionally, as a technique of this kind, a power controlling circuit for a transmitter is disclosed in Unexamined Japanese Patent Publication (Kokai) HEI8-46466. FIG. 2 shows an example of the configuration of the disclosed power controlling circuit for a transmitter. As shown in the figure, the power controlling circuit comprises a gain-variable amplifier 22, an RF (Radio Frequency) power amplifier 23, a directional coupler 24, a detection circuit 26, a comparator 28, a switch 29, and an adder 30.

The gain-variable amplifier 22, the RF power amplifier 23, the directional coupler 24, the detection circuit 26, the comparator 28, the switch 29, and the adder 30 are connected so as to constitute a saturation prevention control loop 40. When an output of the comparator 28 is "H" (high level), the switch 29 is in a conductive state, and, when the output is "L" (low level), the switch is in a nonconductive state. A system power control terminal 31, the adder 30, and the gain-variable amplifier 22 are connected so as to constitute a system power control loop 41.

Since the switch 29 is disposed in the saturation prevention control loop 40, the saturation prevention control loop 40 operates only when the level of the amplified signal is larger than a reference value. In a state other than the above, the system power control loop 41 appropriately operates on the basis of a system power control signal which is supplied through the system power control terminal 31.

In the case where transmission is conducted at the maximum transmission power by means of the system power control loop 41, when the output is caused to exceed the maximum output power by various reasons such as a temperature change, the switch 29 is turned on so that the system power control voltage is lowered. As a result, the RF power amplifier 23 is prevented from saturating and its linear characteristics are maintained.

In the prior art method described above, saturation of the RF power amplifier 23 can be prevented from occurring by the saturation prevention control loop 40. Even though the maximum transmission power is preset by the system power control loop 41, however, a predetermined power may fail to be transmitted because of various reasons such as a temperature change. In such a case, correction is not conducted and hence there arises a problem in that the communication range is narrowed.

SUMMARY OF THE INVENTION

The invention has been conducted in view of the problem discussed above. It is an object of the invention to provide a circuit and method of controlling a transmission power in a CDMA system in which, in order to solve the problem, a change of characteristics in maximum power transmission and due to a temperature change or the like can be compensated by adding an offset voltage to the control voltage, whereby a stable control can be realized.

In order to solve the problem, according to the invention, in a circuit and method of controlling a transmission power in a CDMA system in which an AGC (automatic gain control) amplifier that amplifies a transmission signal, and an RF power amplifier that amplifies an output of the AGC amplifier are disposed, and a gain of the AGC amplifier is controlled by a transmission power control signal to control a transmission power, first comparing means for comparing the transmission power control signal with a predetermined reference value, and second comparing means for detecting the transmission power, and for comparing the detected transmission power with a predetermined reference value are disposed, and, when only the first comparing means outputs an output signal, a signal in a direction along which the transmission power is increased is produced, and, when only the second comparing means outputs an output signal, a signal in a direction along which the transmission power is decreased is produced and the signal is added as an offset signal to the transmission power control signal, and, when both the first and second comparing means output an output signal or when both the first and second comparing means do not output an output signal, a present offset signal is held.

DETAILED DESCRIPTION OF THE PREFERRED EMBODIMENTS

Figure 1:
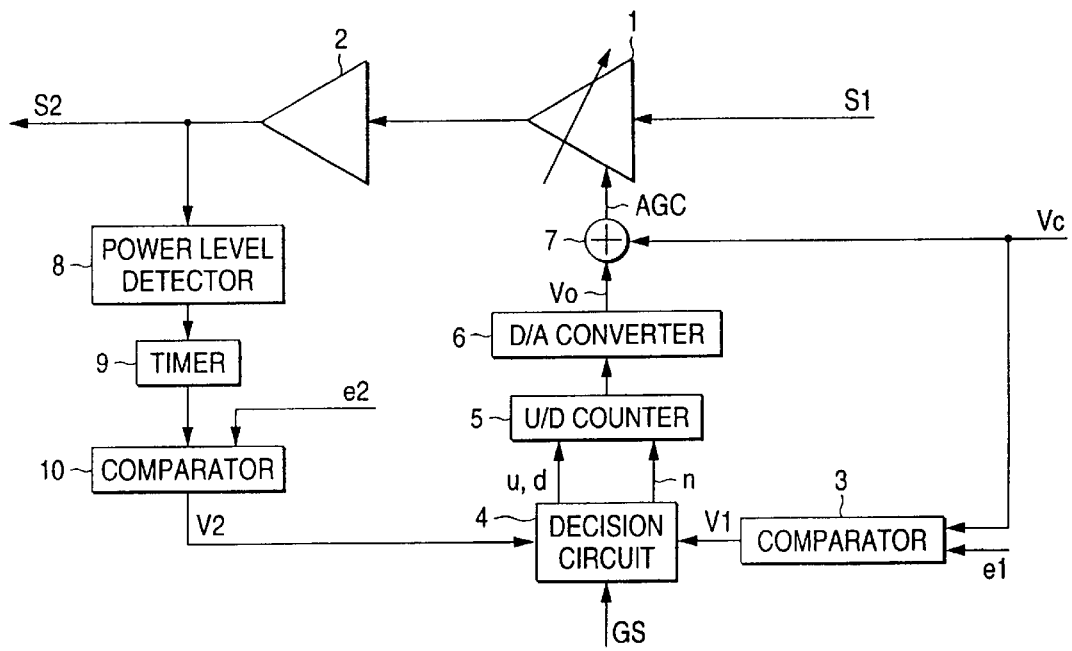
FIG. 1 is a diagram showing an example of the configuration of a transmission power controlling circuit in a CDMA system in which the transmission power controlling method of the invention is implemented.
Figure 2:
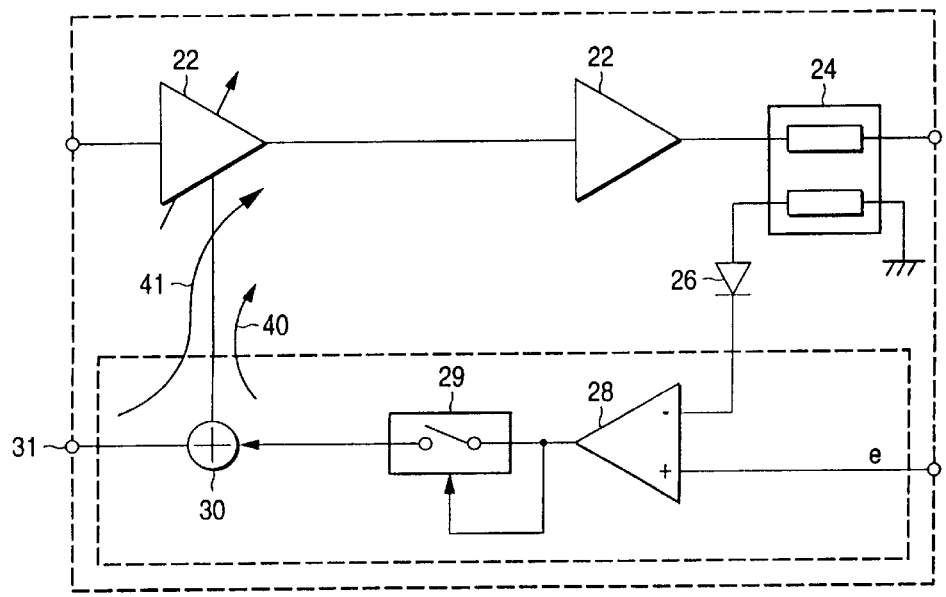
FIG. 2 is a diagram showing an example of the configuration of a transmission power controlling circuit for a transmitter in the prior art.

Hereinafter, an embodiment of the invention will be described in detail with reference to the accompanying drawings. FIG. 1 shows an example of the configuration of a transmission power controlling circuit in a CDMA system in which the transmission power controlling method of the invention is implemented. As shown in the figure, the transmission power controlling circuit in a CDMA system of the invention comprises an AGC (automatic gain control) amplifier 1, an RF power amplifier 2, a comparator 3, a decision circuit 4, an up/down counter 5, a D/A converter 6, an adder 7, an power level detector 8, a timer 9, and a comparator 10.

A transmission signal S1 is amplified by the AGC amplifier 1 and then power-amplified by the RF power amplifier 2 to be output as a transmission output signal S2. In a CDMA system, the transmission powers of mobile terminals are controlled so that transmission signals of the mobile terminals are received at the same level by a base station. A transmission power control voltage Vc is a control voltage for a system power control loop which controls the transmission power, and is supplied as an AGC signal to the AGC amplifier 1 via the adder 7 to control the transmission power to a preset value which is set in accordance with the received signal strength indication.

In the invention, when the mobile terminal operates while the transmission power is set to the maximum one, a phenomenon that the transmission power exceeds the maximum preset value because of various reasons such as a change of the ambient temperature and the RF power amplifier 2 saturates is prevented from occurring, and, when the output is decreased below the maximum preset value, the preset value is maintained. In order to realize the prevention and the maintenance, an offset voltage Vo is generated and the generated offset voltage is added to or subtracted from the transmission power control voltage Vc by the adder 7. Hereinafter, the operation will be described.

The comparator 3 compares the transmission power control voltage Vc with a reference voltage e1, and, when the transmission power control voltage Vc exceeds the reference voltage e1, outputs an output signal V1. The reference voltage e1 is set so as to correspond to the maximum transmission power (at the shipment from the factory). Even when the transmission power control voltage Vc reaches the reference voltage e1, however, the maximum transmission output is sometimes not attained because of various reasons such as a temperature change (the operation will be described later in detail).

The power level detector 8 detects the level of the transmission output signal (power) S2. When the output of the power level detector 8 continues for 1.25 msec. or longer, the timer 9 outputs the detected level of the transmission output signal S2 to the comparator 10. In a CDMA wave, the power is varied at a very high rate, i.e. at a period of 1.25 msec., and the transmission zone is randomly changed depending on the presence of absence of a voice. Therefore, the timer 9 is inserted in order to prevent the comparator 10 from erroneously operating.

The comparator 10 compares the level of the transmission output signal S2 which is detected by the power level detector 8, with a reference voltage e2, and, when the detected level exceeds the reference voltage e2, supplies an output signal V2 to the decision circuit 4. The reference voltage e2 is a transmission-power setting value and set so as to correspond to the maximum transmission power (at the shipment from the factory).

The [KIK1] decision circuit 4 outputs an up signal u to the up/down counter 5 when the output signal V1 of the comparator 3 is input and the output signal V2 of the comparator 10 is 0, and outputs a down signal d to the up/down counter 5 when the output signal V2 of the comparator 10 is input and the output signal V1 of the comparator 3 is 0. When both the output signals V1 and V2 are 0, or when both the output voltages V1 and V2 are input, the decision circuit outputs a hold signal h so that the present output is held.

A gated signal GS is a signal indicative of the transmission signal zone. When the gated signal GS does not exist, the transmission is not conducted. In a CDMA wave, the transmission zone is randomly changed depending on the presence of absence of a voice. Therefore, the gated signal is supplied to the decision circuit 4 in order to prevent the decision circuit 4 from erroneously operating even through the transmission is not conducted. During a period when the gated signal GS is transmitted, the decision circuit 4 transmits the signals u, d, and h to the up/down counter 5, once every 1.25 msec.

The up/down counter 5 supplies to the D/A converter 6, a count number in the form of a digital signal which corresponds to the up signal u, the down signal d, or the hold signal h (in the case of the up signal u, the positive count number, and in the case of the down signal d, the negative count number). The D/A converter 6 D/A-converts the output signal of the up/down counter 5, and-then supplies the D/A-converted signal to the adder 7. The adder 7 adds the transmission power control voltage Vc and the D/A-converted output signal of the up/down counter 5.

According to the present control method, in the initial setting (conducted at the shipment from the factory), both the reference voltages e1 and e2 are set so as to correspond to the maximum transmission power, and the offset voltage Vo is set to 0. In a use in the practical field, when the mobile terminal is used at the maximum transmission power because the terminal is remote from a base station, the maximum transmission output is sometimes not attained because of various reasons such as a temperature change although the transmission power control voltage Vc reaches the reference voltage e1. In this case, the output signal V1 of the comparator 3 is output and the output signal V2 of the comparator 10 is not output. Therefore, the decision circuit 4 outputs the up signal u to the up/down counter 5.

The up/down counter 5 outputs to the D/A converter 6, the count number of the up signal u according to the input. The D/A converter 6 converts the count number into an analog value, and outputs the analog value as the offset voltage Vo to the adder 7. The adder 7 adds the offset voltage Vo to the transmission power control voltage Vc, and outputs a result of the addition as the AGC signal to the AGC amplifier 1, with the result that the transmission output signal S2 is increased. This increase is continued until the level of the transmission output signal S2 detected by the power level detector 8 becomes equal to higher than the reference voltage e2 and the output signal V2 is output from the comparator 10.

When the transmission power control voltage Vc fails to reach the reference voltage e1 and the transmission output signal S2 exceeds the reference voltage e2 even though the output signal V1 of the comparator 3 is 0, the comparator 10 outputs the output signal V2 and the decision circuit 4 outputs the down signal d to the up/down counter 5. The up/down counter 5 outputs to the D/A converter 6, the count number (a negative number) of the down signal d according to the input. The D/A converter 6 converts the output into an analog value, and outputs the analog value as the offset voltage Vo (a negative voltage) to the adder 7. The adder 7 conducts an addition (subtraction) of the offset voltage Vo and the transmission power control voltage Vc, and outputs a result of the addition (subtraction) as the AGC signal to the AGC amplifier, with the result that the transmission output signal (power) S2 is decreased.

When both the output signal V1 of the comparator 3 and the output signal V2 of the comparator 10 are output. The transmission power control voltage Vc is set to the maximum value, and also the transmission output signal S2 detected by the power level detector 8 is maximum. Therefore, the decision circuit 4 outputs the hold signal h to the up/down counter 5, and the current status of the up/down counter 5 is held. This state is cancelled when only the output signal V1 of the comparator 3 is output or only the output signal V2 of the comparator 10 is output.

Also when both the output signal V1 of the comparator 3 and the output signal V2 of the comparator 10 are 0, the decision circuit 4 outputs the hold signal h and the same operations as those described above are conducted.

As described above, in the embodiment of the invention, when transmission is conducted at the maximum transmission power and the transmission power is caused to be decreased or increased by various reasons such as a temperature change, the offset voltage Vo for correcting the change is generated and the offset voltage is added to the transmission power control voltage Vc so as to hold the maximum transmission power. Therefore, the RF power amplifier 2 for the transmission output is prevented from saturating and its linear characteristics are maintained. Furthermore, the maximum transmission power is not decreased below the preset value, and hence also the communication range is maintained.

As described above, according to the invention, first comparing means for comparing the transmission power control signal with a predetermined reference value, and second comparing means for detecting the transmission power, and for comparing the detected transmission power with a predetermined reference value are disposed, and when only the first comparing means outputs an output signal, a signal in a direction along which the transmission power is increased is produced, and, when only the second comparing means outputs an output signal, a signal in a direction along which the transmission power is decreased is produced and the signal is added as an offset signal to the transmission power control signal, and, when both the first and second comparing means output an output signal or when both the first and second comparing means do not output an output signal, a present offset signal is held. Therefore, the invention is expected to attain the following excellent effects.

When a predetermined output power fails to be transmitted because of various reasons such as a temperature change, the transmission power is increased until the second excess power detecting means detects the transmission power. Therefore, the communication range can be maintained.

When the second excess power detecting means outputs a signal even though the transmission power control signal fails to reach the maximum transmission power, the transmission power is decreased. Therefore, the RF power amplifier serving as a transmission device is prevented from saturating and its linear characteristics can be maintained.

What is claimed is:

1. A method of controlling a transmission power in a CDMA system in which an AGC (automatic gain control) amplifier amplifies a transmission signal, and an RF power amplifier amplifies an output of said AGC amplifier, and a gain of said AGC amplifier is controlled by a transmission power control signal to control a transmission power, the controlling method comprising the steps of:

providing first comparing means for comparing the transmission power control signal with a first predetermined reference value, and second comparing means for detecting the transmission power and comparing the detected transmission power with a second predetermined reference value;

producing a upward signal for increasing the transmission power when only said first comparing means outputs an output signal, while producing a downward signal for decreasing the transmission power when only said second comparing means outputs an output signal, said upward signal and downward signal being added as an offset signal to the transmission power control signal; and holding a present offset signal when both said first and second comparing means output an output signal or when both said first and second comparing means do not output an output signal.

2. A circuit for controlling a transmission power in a CDMA system, comprising:

an AGC (automatic gain control) amplifier for amplifing a transmission signal, a gain of which is controlled by a transmission power control signal to control a transmission power;

an RF power amplifier for amplifing an output of said AGC amplifier;

first comparing means for comparing the transmission power control signal with a first predetermined reference value;

second comparing means for detecting the transmission power and comparing the detected transmission power with a second predetermined reference value;

decision means for producing an upward signal to increase the transmission power when only said first comparing means outputs an output signal, while for producing a downward signal to decrease the transmission power when only said second comparing means outputs an output signal;

adding means for adding said upward signal and downward signal as an offset signal to the transmission power control signal;

wherein said decision means holds a present offset signal when both said first and second comparing means output an output signal or when both said first and second comparing means do not output an output signal.

3. A controlling circuit as claimed in claim 2, wherein said second comparing means comprises: a comparator for comparing the detected transmission power with the second predetermined reference value; a power level detector for detecting a level of the transmission power and a timer for outputting the detected level of the transmission power to the comparator only when the output of the power level detector continues for the predetermined period or longer.

* * * * *